United States Patent
Hattori et al.

(10) Patent No.: US 9,000,541 B2
(45) Date of Patent: Apr. 7, 2015

(54) PHOTOELECTRIC CONVERSION DEVICE AND ELECTRONIC APPARATUS

(75) Inventors: Yasunori Hattori, Shiojiri (JP);
Tomotaka Matsumoto, Matsumoto (JP);
Tsukasa Eguchi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 13/367,741

(22) Filed: Feb. 7, 2012

(65) Prior Publication Data

US 2012/0205649 A1     Aug. 16, 2012

(30) Foreign Application Priority Data

Feb. 16, 2011   (JP) ................. 2011-030535

(51) Int. Cl.
H01L 27/14 (2006.01)
H01L 27/146 (2006.01)

(52) U.S. Cl.
CPC ..... *H01L 27/14632* (2013.01); *H01L 27/14645* (2013.01)

(58) Field of Classification Search
USPC ............. 257/233, 290–294, 414–415, 420, 257/431–436, 444, 461–463, E31.097, 257/E27.133–E27.152, E25.032
See application file for complete search history.

(56) References Cited

U.S. PATENT DOCUMENTS

| | | | |
|---|---|---|---|
| 2006/0220059 A1* | 10/2006 | Satoh et al. | 257/184 |
| 2007/0227578 A1 | 10/2007 | Perozziello et al. | |
| 2009/0293954 A1* | 12/2009 | Yamazaki | 136/258 |
| 2009/0301558 A1 | 12/2009 | Takaoka et al. | |
| 2010/0098304 A1* | 4/2010 | Kiyomizu et al. | 382/124 |
| 2010/0102368 A1 | 4/2010 | Matsushima et al. | |
| 2010/0243057 A1* | 9/2010 | Nakatani et al. | 136/261 |
| 2010/0275965 A1* | 11/2010 | Lee et al. | 136/244 |
| 2010/0276738 A1 | 11/2010 | Matsushima et al. | |
| 2011/0018089 A1 | 1/2011 | Hakuma et al. | |
| 2011/0092013 A1* | 4/2011 | Isaka et al. | 438/89 |

FOREIGN PATENT DOCUMENTS

| | | |
|---|---|---|
| JP | 2004-363290 A | * 12/2004 |
| JP | A-2007-123720 | 5/2007 |
| WO | WO 2008/093834 A1 | 8/2008 |

OTHER PUBLICATIONS

M. Bar et al.; "Zn(O,OH) Layers in Chalcopyrite Thin-Film Solar Cells: Valence-Band Maximum Versus Composition," Journal of Applied Physics, vol. 90, American Institute of Physics, Sep. 7, 2005, pp. 053702-1-053702-8 , XP012078491, ISSN: 0021-8979, New York.

(Continued)

*Primary Examiner* — David Vu
*Assistant Examiner* — Cuong B Nguyen
(74) *Attorney, Agent, or Firm* — Oliff PLC

(57) ABSTRACT

A photoelectric conversion device includes circuit portions disposed on a substrate, a first electrode electrically connected to one of the circuit portions, an optically transparent second electrode opposing the first electrode, and a photoelectric conversion portion disposed between the first electrode and the second electrode. The photoelectric conversion portion has a multilayer structure including a light absorption layer made of a p-type compound semiconductor film having a chalcopyrite structure, an amorphous oxide semiconductor layer, and a window layer made of an n-type semiconductor film.

9 Claims, 5 Drawing Sheets

(56) References Cited

OTHER PUBLICATIONS

Platzer-Bjorkman et al., "Zn(O,S) Buffer Layers by Atomic Layer Deposition in Cu (In,GA)Se$_2$ Based Thin Film Solar Cells: Band Alignment and Sulfur Gradient," Journal of Applied Physics, New York, vol. 100, No. 4, Aug. 23, 2006, pp. 044506-1-044506-9, XP012989821, ISSN: 0021-8979.

Jun. 27, 2012 Extended European Search Report issued in EP 12 15 5324.

\* cited by examiner

PHOTOELECTRIC CONVERSION DEVICE AND ELECTRONIC APPARATUS

This application claims priority to JP 2011-030535, filed Feb. 16, 2011. The disclosure of the priority application is hereby incorporated by reference herein in its entirety.

BACKGROUND

1. Technical Field

The present invention relates to a photoelectric conversion device that converts light energy into electrical energy, and the electronic apparatus including the photoelectric conversion device.

2. Related Art

A solar cell including a light absorption layer is a typical example of photoelectric conversion devices. The light absorption layer may be made of a CIS thin film, such as a $CuInSe2$ or $CuInGaS_e$ film, which is an p-type semiconductor film having a chalcopyrite structure. CIS thin films have high photosensitivity to light over a wide range of wavelengths from visible light to near-infrared light, and are accordingly expected to be used in photodetectors. On the other hand, CIS thin films are liable to be damaged when being formed for a photodetector, and the damaged CIS film undesirably causes leakage of current.

International Publication No. 2008/093834 discloses a method for manufacturing a solid state image pickup device that includes patterning a compound semiconductor film (CIS thin film) formed on a lower electrode layer by photolithography so as to be divided with the lower electrode layer for each pixel, forming a buffer layer so as to cover the compound semiconductor film, and forming an optically transparent electrode layer on the buffer layer.

In this method, the buffer layer is formed between the compound semiconductor film and the optically transparent electrode layer. The buffer layer alleviates the damage to the compound semiconductor film that may occur when the optically transparent electrode layer is formed, and thus can reduce leakage of current resulting from the damage.

JP-A-2007-123720 discloses a photoelectric conversion device including an optically transparent electrode layer that is disposed in such a manner that the ends of the compound semiconductor film are located on the outside of the ends of the optically transparent electrode layer. According to this disclosure, since the ends of the compound semiconductor film are located on the outside of the ends of the optically transparent electrode layer, leakage of current can be reduced even if the compound semiconductor film is damaged at an end thereof or has a crystal defect therein by an operation for patterning the compound semiconductor film.

While the solid state image pickup device produced by the method disclosed in International Publication No. 2008/093834 is effective in reducing leakage of current that may occur when a forward bias is applied, however, it is difficult to reduce leakage of current (dark current) that may occur when a reverse bias is applied.

In either disclosure of International Publication No. 2008/093834 or JP-A-2007-123720, a crystalline CdS buffer layer is formed between a compound semiconductor film and an optically transparent electrode layer by a solution growth method that can form a film having high coating power. However, if the CdS film has a crystal defect, leakage of current occurs undesirably at the position of the crystal defect.

SUMMARY

Accordingly, the present invention has been made to solve at least part of the above issues, and the following embodiments of the invention can be provided.

Application 1

According to an aspect of the invention, a photoelectric conversion device is provided which includes a first electrode, an optically transparent second electrode opposing the first electrode, a photoelectric conversion portion between the first electrode and the second electrode. The photoelectric conversion portion includes a light absorption layer made of a p-type chalcopyrite compound semiconductor film, a window layer made of an n-type semiconductor film, and an amorphous oxide semiconductor layer between the light absorption layer and the window layer.

By providing an amorphous oxide semiconductor layer having a larger band gap than the light absorption layer made of a p-type compound semiconductor film between the p-type compound semiconductor film and an n-type semiconductor film, a potential barrier is formed at the interface between the p-type and the n-type semiconductor film. The amorphous oxide semiconductor layer can act as a buffer layer having a higher resistance than the CdS film whose resistance varies when receiving light. Accordingly, the electric field can be concentrated in the oxide semiconductor layer when a forward bias is applied, and drift current (electrons) that can cause leakage of current can be reduced when a reverse bias is applied.

In addition, since the oxide semiconductor layer is amorphous unlike the crystalline CdS film and does not have a crystal defect, dark current can be reliably reduced.

Application 2

Preferably, the amorphous oxide semiconductor layer of the above photoelectric conversion device contains a Group 12 element and a Group 13 element.

Consequently, the band gap of the amorphous oxide semiconductor layer is increased to 3 eV or more, and thus can reduce the loss of light irradiating the light absorption layer in comparison with the known CdS film (having a band gap of 2.4 eV).

Application 3

The amorphous oxide semiconductor layer may contain In, Ga and Zn.

This amorphous oxide semiconductor layer ensures a band gap of 3 eV or more.

Application 4

In the above photoelectric conversion device, the photoelectric conversion portion may have been formed by patterning on the substrate and has a side wall formed by the patterning. The side wall and the outer edge of the surface of the photoelectric conversion portion opposing the second electrode are covered with an insulating film.

Thus, leakage of current resulting from the damage at the side wall and its vicinity of the photoelectric conversion portion caused by patterning the photoelectric conversion portion can be reduced.

Application 5

The window layer may include the second electrode and be disposed so as to oppose a plurality of the first electrodes.

This makes the structure of the photoelectric conversion device simple, and accordingly, the photoelectric conversion device can be superior in a value-for-money sense.

Application 6

According to another aspect of the invention, an electronic apparatus including the above-described photoelectric conversion device is provided.

The photoelectric conversion device can perform stable photoelectric conversion even when a reverse bias is applied, and the photoelectric conversion portion of the device may be used as a photosensor of an electronic apparatus. Thus, an electronic apparatus including a photoelectric conversion device (image sensor) exhibiting high electro-optic characteristics can be achieved.

BRIEF DESCRIPTION OF THE DRAWINGS

The invention will be described with reference to the accompanying drawings, wherein like numbers reference like elements.

DETAILED DESCRIPTION OF EMBODIMENTS

Figure 1A:
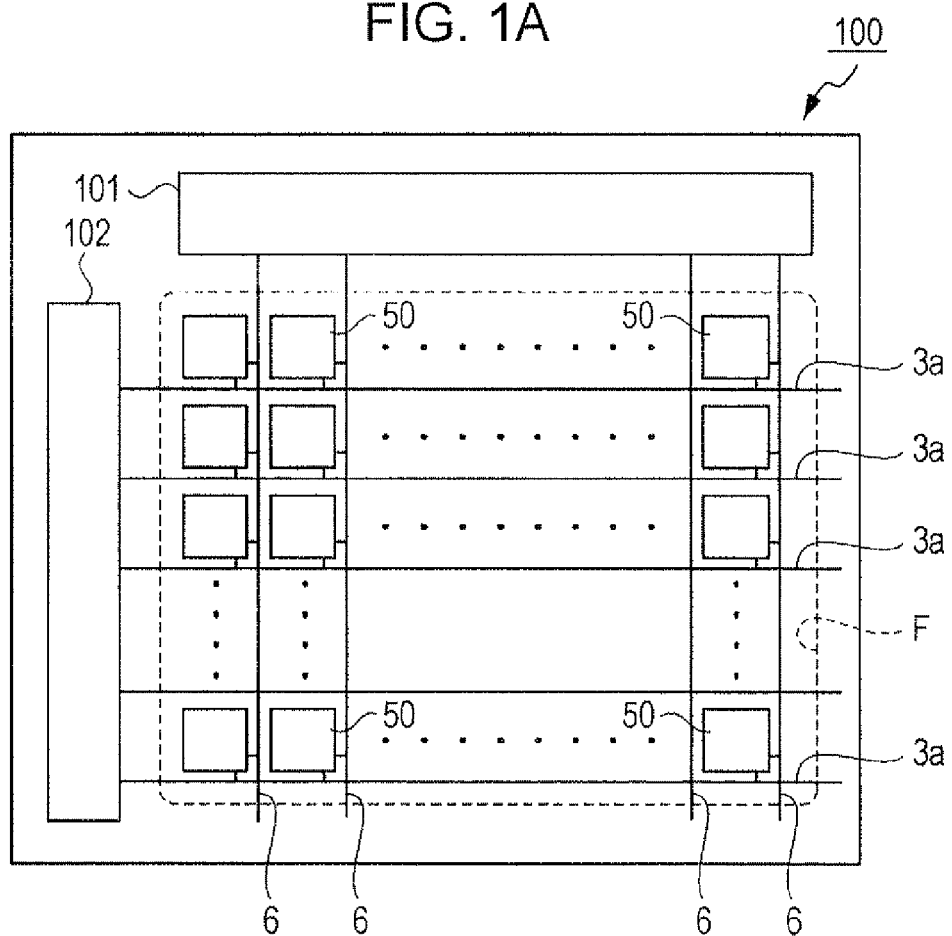
FIG. 1A is a schematic wiring diagram showing the electrical configuration of an image sensor.

Some embodiments of the invention will be described with reference to the drawings. For the sake of visibility, the dimensional proportions of the parts shown in the drawings may differ as needed.

In the following description, something "on a/the substrate" means that it may be disposed directly on the substrate so as to be in contact with the substrate, disposed on the substrate with another member therebetween, or disposed in such a manner that one or some parts of it are in contact with the substrate, but the other is on another member disposed on the substrate.

In the following description, an image sensor will be described as an embodiment of the photoelectric conversion device. In an embodiment of the electronic apparatus of the invention, a biometric authentication apparatus including the image sensor will be described.
Photoelectric Conversion Device An image sensor will now be described as an embodiment of the photoelectric conversion device of the invention with reference to FIG. 1A to FIG. 3.

Figure 1B:
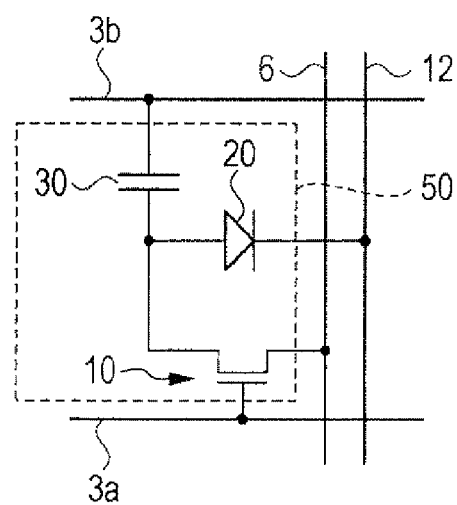
FIG. 1B is an equivalent circuit diagram of a photoelectric conversion element used as a photosensor.
Figure 2:
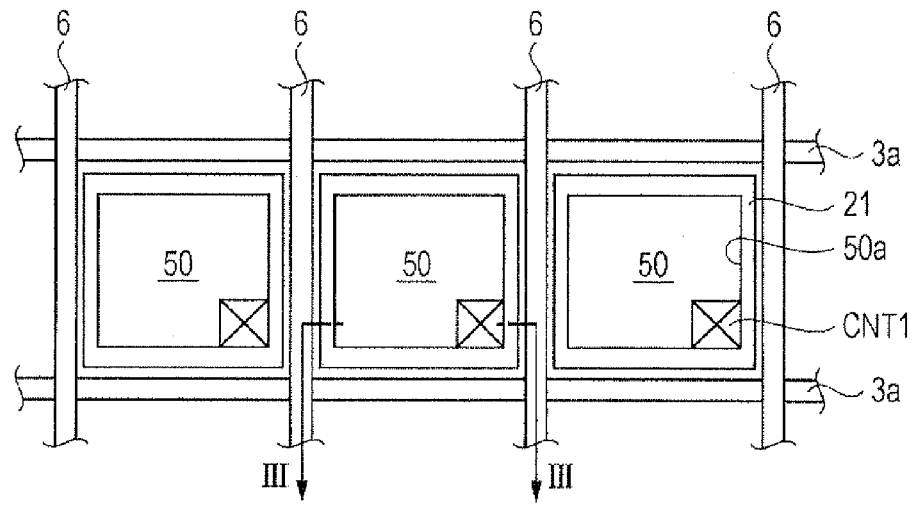
FIG. 2 is a schematic plan view of an arrangement of the photosensors.
Figure 3:
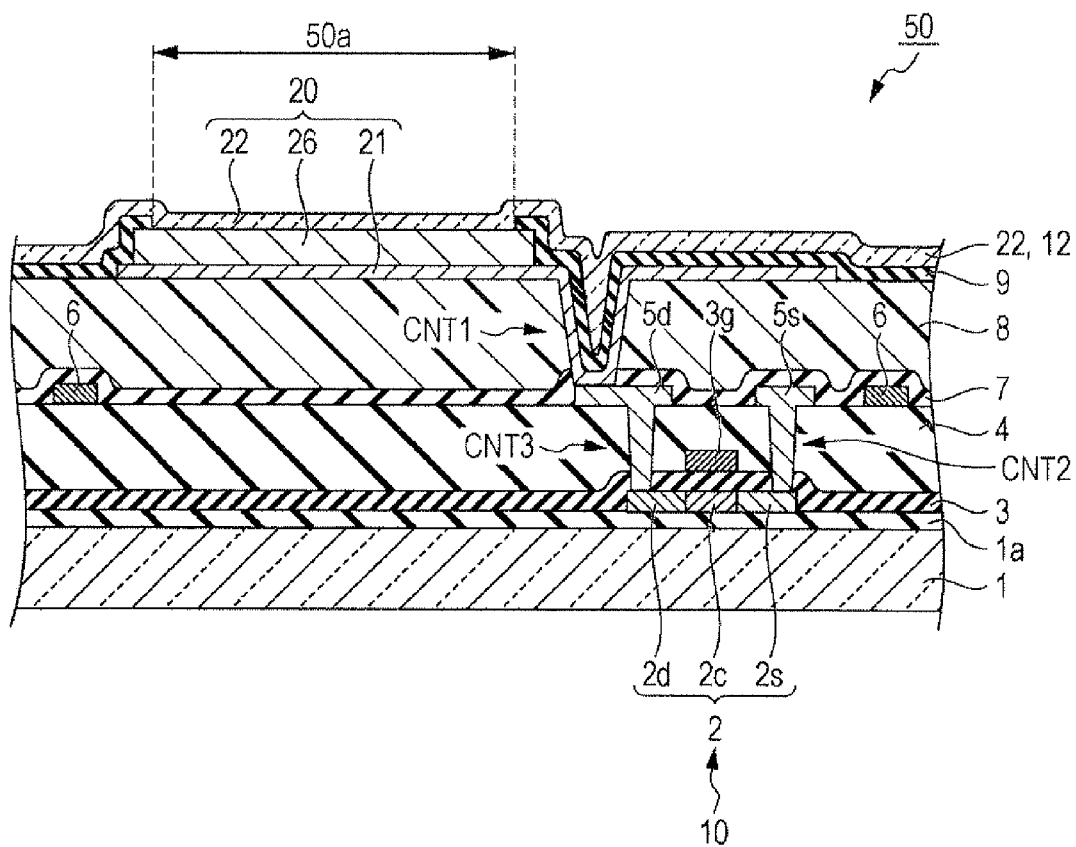
FIG. 3 is a schematic sectional view of the photosensor taken along line III-III in FIG. 2.

FIG. 1A is a schematic wiring diagram showing the electrical configuration of an image sensor, and FIG. 1B is an equivalent circuit diagram of a photoelectric conversion element used as a photosensor. FIG. 2 is a schematic plan view of the arrangement of the photosensors, and FIG. 3 is a schematic sectional view of the photosensor taken along line III-III in FIG. 2.

As shown in FIG. 1A, the image sensor 100, or photoelectric conversion device, includes a plurality of scanning lines 3a and data lines 6 extending so as to intersect with each other in an element region F. The image sensor 100 also includes a scanning line circuit 102 to which the scanning lines 3a are electrically connected, and a data line circuit 101 to which the data lines 6 are electrically connected. Photosensors 50 are arranged in a matrix manner in the element region F, corresponding to vicinities of the intersections of the scanning lines 3a and the data lines 6.

As shown in FIG. 1B, each photosensor 50 includes a thin film transistor (TFT) 10, a photodiode 20, and a hold capacitor 30. The gate electrode of the TFT 10 is connected to the scanning line 3a, and the source electrode of the TFT 10 is connected to the data line 6. One end of the photodiode 20 is connected to the drain electrode of the TFT 10, and the other end is connected to a constant potential line 12 extending in parallel with the data line 6. One of the electrodes of the hold capacitor 30 is connected to the drain electrode of the TFT 10, and the other is connected to a constant potential line 3b extending in parallel with the scanning line 3a.

As shown in FIG. 2, the photosensors 50 each have a substantially square first electrode 21 and a contact hole CNT1 in a region partitioned by the scanning lines 3a and the data lines 6 when viewed from above. The first electrode 21 is connected to the TFT 10 through the contact hole CNT1. Light-receiving regions 50a are each defined by the overlap region, except the contact hole CNT1, of the photosensor 50 with the first electrode 21.

As shown in FIG. 3, the photosensor 50 is disposed on, for example, a transparent glass or opaque silicon substrate 1.

The surface of the substrate 1 is covered with an insulating film 1a, and a polycrystalline silicon semiconductor layer 2 is disposed in an island manner on the insulating film 1a. The semiconductor layer 2 is covered with a gate insulating layer 3 made of an insulating material such as silicon oxide ($SiO_2$).

On the gate insulating layer 3, a gate electrode 3g is formed so as to oppose the channel region 2c of the semiconductor layer 2. The gate electrode 3g is electrically connected to the scanning line 3a shown in FIG. 1, and is made of a metal such as aluminum (Al).

The gate electrode 3g and the gate insulating layer 3 are covered with an insulating interlayer 4. In the gate insulating layer 3 and the insulating interlayer 4, through holes are formed in portions overlapping with the drain region 2d and source region 2s of the semiconductor layer 2. The through holes are filled with a metal such as Al, and an electroconductive film is formed of the same metal so as to cover the insulating interlayer 4. The electroconductive film is patterned, thus forming contact holes CNT2 and CNT3, a drain electrode 5d, a source electrode 5s and a data line 6. The source electrode 5s is connected to the source region 2s of the semiconductor layer 2 through contact hole CNT2, and is further connected to the data line 6. The drain electrode 5d is connected to the drain region 2d of the semiconductor layer 2 through contact hole CNT3.

The drain electrode 5d, the source electrode 5s, the data line 6 and the insulating interlayer 4 are covered with an insulating film 7, and a planarizing layer 8 is disposed over the entire surface of the insulating film 7. The planarizing layer 8 is made of, for example, silicon oxide ($SiO_2$), and the insulating film 7 is made of silicon nitride (SiN), which is more compact than $SiO_2$.

In the insulating film 7 and the planarizing layer 8, a through hole is formed in the portion overlapping with the drain electrode 5d. The through hole is filled with a metal such as molybdenum, and, further, an electroconductive film is formed of the same metal to cover the planarizing layer 8. The electroconductive film is patterned, thus forming contact hole CNT1 and a first electrode 21. The first electrode 21 is electrically connected to the drain electrode 5d through contact hole CNT1.

A photoelectric conversion portion 26 is disposed apart from contact hole CNT1 on the first electrode 21, and an insulating film 9 covering the first electrode 21 and the planarizing layer 8 is formed so as to cover the side wall and outer edge of the photoelectric conversion portion 26. As with the insulating layer 7, an insulating film 9 is formed of SiN.

The insulating film 9 and the photoelectric conversion portion 26 are covered with a second electrode 22. The second electrode 22 is made of an optically transparent electroconductive film of, for example, indium tin oxide (ITO) or indium zinc oxide (IZO), and doubles as the constant potential line 12 shown in FIG. 1B.

The first electrode 21, the second electrode 22 and the photoelectric conversion portion 26 between the first and second electrodes 21 and 22 constitute a photodiode 20. The region of the photoelectric conversion portion 26 not covered with the insulating film 9 is defined as a light-receiving region 50a.

Circuit portions are disposed on the substrate 1. The circuit portions include the scanning lines 3a, the data lines 6 and the constant potential lines 3b, and 12 the TFTs 10 connected to those lines, the hold capacitors 30, the data line circuit 101, and the scanning line circuit 102, shown in FIGS. 1A and 1B. The data line circuit 101 to which the data lines 6 are connected, and the scanning line circuit 102 to which the scanning lines 3a are connected may be separately provided in the form of an integrated circuit on the substrate 1.

In the image sensor 100 of the present embodiment, when light enters the photodiode 20 to which a reverse bias is applied through the constant potential lines 3b and 12, a photocurrent flows into the photodiode 20 and a charge is stored in the hold capacitor 30.

By turning on (selecting) the TFTs 10 through the corresponding scanning lines 3a, a signal according to the charge stored in each hold capacitor 30 of the photosensors 50 is outputted one after another to the corresponding data line 6. Consequently, each photosensor 50 detects the intensity of light that has been received in the corresponding element region F.

From the viewpoint of using the image sensor 100 in a biometric authentication apparatus, which is a type of electronic apparatus, the present inventors has developed the photodiode 20 as a reliable photoelectric conversion element that can detect near-infrared light with high sensitivity.

Figure 4:
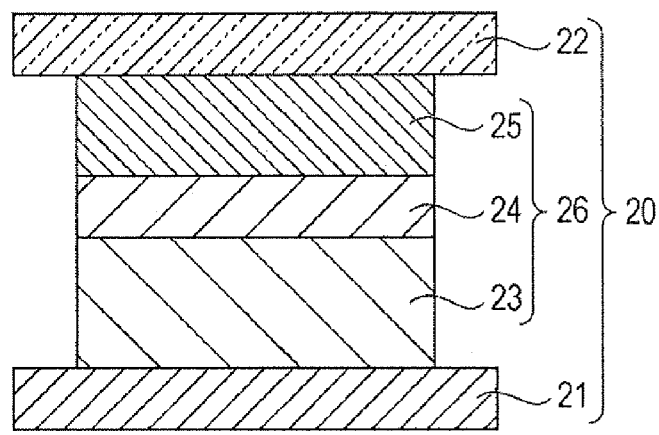
FIG. 4 is a schematic diagram of a photodiode.
Figure 5:
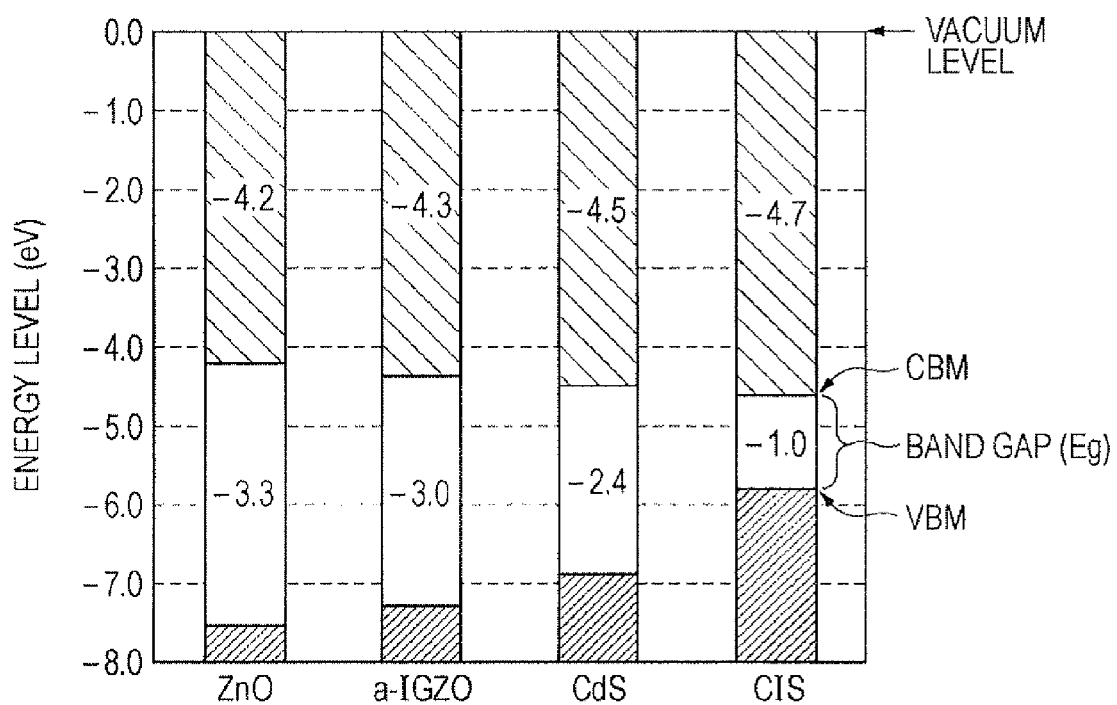
FIG. 5 is a graph of energy band gaps of semiconductor films constituting photodiodes of the Example and the Comparative Example.
Figure 6A:
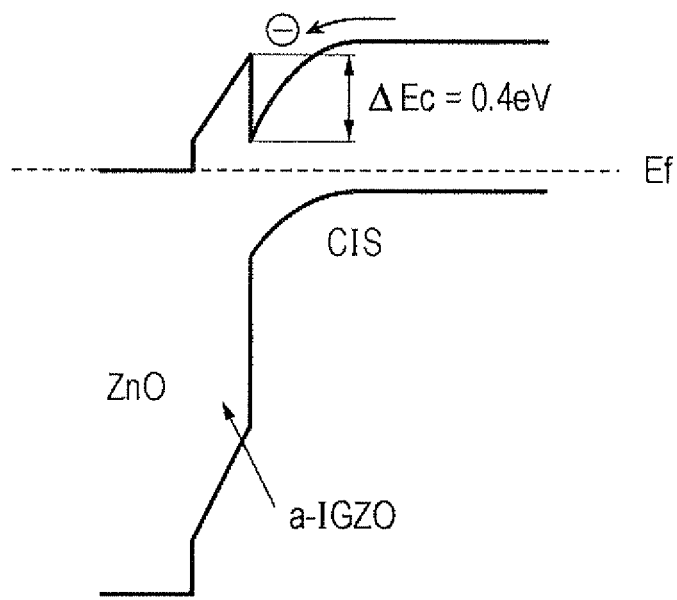
FIGS. 6A and 6B are schematic representations of the band gap structures of the photodiodes of the Example and the Comparative Example, respectively.
Figure 6B:
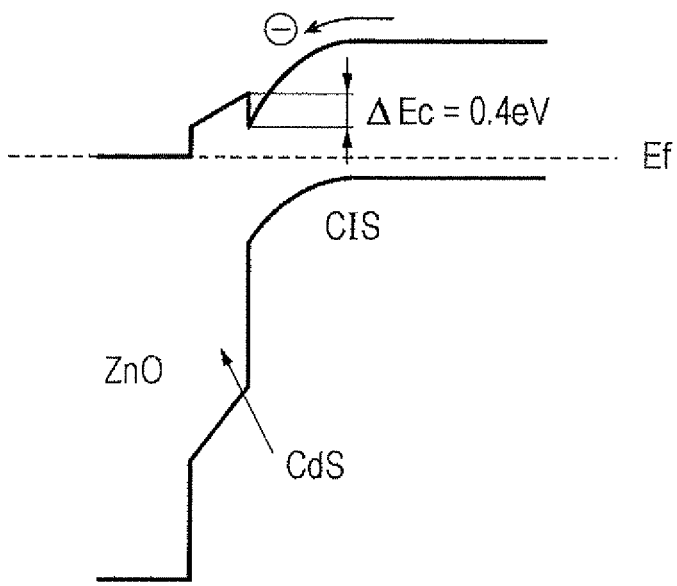

An example of the photodiode 20 will now be described with reference to FIGS. 4 to 6A and 6B. FIG. 4 is a schematic diagram of the photodiode 20. FIG. 5 is a graph showing the energy bands of the semiconductor films of the photodiodes used in the Example and the Comparative Example. FIG. 6A is a schematic diagram of the energy band structure of the photodiode of the Example, and FIG. 6B is a schematic diagram of the energy band structure of the photodiode of the Comparative Example.

As shown in FIG. 4, the photodiode 20 of the present embodiment includes the photoelectric conversion portion 26 between the first electrode 21 and the optically transparent second electrode 22. The photoelectric conversion portion 26 includes a light absorption layer 23 made of a p-type compound semiconductor film, an amorphous oxide semiconductor layer 24 and a window layer 25 made of an n-type semiconductor film, These layers of the photoelectric conversion portion 26 are formed on the first electrode 21 in that order.

EXAMPLE

The first electrode 21 may be formed of a metal such as Mo (molybdenum), Nb (niobium), Ta (tantalum) or W (tungsten) by sputtering. In the Example, the first electrode 21 was formed on Mo to a thickness of about 400 nm.

The p-type compound semiconductor film acting as the light absorption layer 23 may be formed of a CIS (for example, $CuInSe_2$ or CuInGaSe) thin film having a chalcopyrite structure. In the Example, the light absorption layer 23 was formed of $CuInSe_2$ to a thickness of about 1.5μ (1500 nm) by sputtering.

In the CIS thin film of the light absorption layer 23 having a composition $Cu(In_x, Ga_{1-x})Se_2$ (0≤x≤1), the wavelength band of light that the light absorption layer 23 can absorb can be expanded up to about 1300 nm or the near-infrared region by altering the composition from $Cu(InGa)Se_2$ to $CuInSe_2$.

It is preferable that the amorphous oxide semiconductor layer 24 contain Group 12 and Group 13 elements, which are defined by International Union of Pure and Applied Chemistry (IUPAC). In the Example, the amorphous oxide semiconductor layer 24 was formed of amorphous InGaZnO (a-IGZO). This film was able to be formed by sputtering. Also, when the thickness was reduced to less than 50 nm, the electrical resistance was reduced to a level lower than the electrical resistance with which a film can appropriately function as a potential barrier, and the variation produced by forming the film seriously affected the characteristics of the photodiode 20. When the thickness was increased to more than 500 nm, the resistance was excessively increased. Accordingly, it was found that the preferred thickness of the amorphous oxide semiconductor layer 24 is 50 to 500 nm.

The n-type semiconductor film of the window layer 25 can be formed by, for example, continuous sputtering for forming a non-doped i-ZnO (zinc oxide) film and a ZnO(n+) film doped with an n-type dopant. In the Example, the i-ZnO film was formed to a thickness of about 60 nm, and the ZnO(n+) film was formed to a thickness of about 1000 nm.

The second electrode 22 can be made of a transparent electroconductive film of, for example, ITO or IZO as described above by vacuum vapor deposition or sputtering. In the Example, the second electrode 22 was formed of ITO to a thickness of about 100 nm.

Alternatively, the n-type semiconductor film may double as the second electrode 22 if the thickness of the ZnO(n+) film doped with an n-type dopant is reduced to about 500 nm to reduce the resistance or an AZO film doped with aluminum (Al) is used. Thus, the second electrode 22 may be omitted.

Comparative Example

Unlike the photodiode 20 of the Example, the photodiode of the Comparative Example included a CdS film that is used as the buffer layer of the solid-state imaging element disclosed in the above-cited patent document International Publication No. 2008/093834, instead of the amorphous oxide semiconductor layer 24. The thickness of the CdS film was about 50 nm. The structures of other components were the same as in the Example, including the first electrode 21, the light absorption layer 23, the widow layer 25 and the second electrode 22.

FIG. 5 shows the energy band gaps of the semiconductor films used in the Example and the Comparative Example. The band gaps Eg (forbidden band width) between the energy levels of the conduction band minimum (CBM), which represents electron affinity, and the valence band maximum (VBM) of the ZnO, a-IGZO, CdS and $CuInSe_2$ films were 3.3 eV, 3.0 eV, 14 eV and 1.0 eV, respectively.

More specifically, in the Example and the Comparative Example, when a forward bias is applied between the first electrode 21 and the second electrode 22, electrons injected through the ZnO film move (flow) to the CIS film having higher electron affinity (the energy level of the CBM is the lowest).

As shown in FIG. 6A, the photodiode 20 of the Example has a potential barrier (conduction band offset, CBO) between the CIS film, which is the p-type compound semiconductor film acting as the light absorption layer 23, and the a-IGZO film as the amorphous oxide semiconductor layer 24. The magnitude DEc of the potential barrier is 0.4 eV, which is the difference between the energy level (−4.3 eV) of the CBM of the a-IGZO film and the energy level (−4.7 eV) of the CBM of the CIS film.

On the other hand, in the photodiode of the Comparative Example, the magnitude DEc of the potential barrier between the CIS film and the CdS film is 0.2 eV, which is the difference between the energy level (−4.5 eV) of the CBM of the CdS film and the energy level (−4.7 eV) of the CBM of the CIS film.

Thus, the potential barrier of the photodiode 20 of the Example is larger than that of the Comparative Example. Accordingly, in the structure of the Example, electrons cannot easily flow to the window layer 25 made of an n-type semiconductor film (ZnO film) even if a reverse bias is applied between the first electrode 21 and the second electrode 22 so as to introduce electrons through the light absorption layer 23 or p-type compound semiconductor film (CIS film) in comparison with the structure of the Comparative Example. Hence, drift current (electrons) that can cause leakage of current (dark current) when a reverse bias is applied can be reduced.

Accordingly, the above-described embodiment of the invention can provide the following advantages:

(1) The image sensor 100 used as a photoelectric conversion device includes an amorphous oxide semiconductor layer 24 having a larger band gap than the CdS film between the light absorption layer 23 and an n-type semiconductor film, and this structure provides a potential barrier at the interface between the p-type and the n-type semiconductor film. In addition, the electric field is more likely to concentrate in the high-resistance oxide semiconductor layer 24 than the CdS film whose resistance varies while receiving light. Accordingly, the electric field in other layers (at the surface of the light absorption layer 23, the pn junction, and so on) is reduced, and consequently, recombination through a defect in such layers can be suppressed. Therefore, the photodiode 20 of the photosensor 50 can be highly sensitive to near-infrared light, and the leakage of current (dark current) in the photodiode 20 can be reduced even when a reverse bias is applied between the first electrode 21 and the second electrode 22. Accordingly, the image sensor 100 can achieve photo detection stable to near-infrared light.

(2) Since the oxide semiconductor layer 24 between the light absorption layer 23 and the window layer 25 is amorphous and does not have a crystal defect, unlike the CdS film of the Comparative Example, leakage of current resulting from the crystal defect can be prevented.

(3) The amorphous oxide semiconductor layer 24 made of an a-IGZO film containing a Group 12 element Zn and Group 13 elements Ga and In can achieve a band gap Eg of 3.0 eV or more. This band gap is wider than the band gap of the CdS film (band gap Eg: 2.4 eV) of the Comparative Example. Accordingly, the loss of light irradiating the light absorption layer 23 can be reduced.

(4) Since the side wall and outer edge of the photoelectric conversion portion 26 formed apart from the contact hole CNT1 by patterning are covered with an insulating film 9, damage to the side wall and its vicinity can be reduced, and thus leakage of current caused by the damage can be suppressed.

Biometric Authentication Apparatus

Figure 7A:
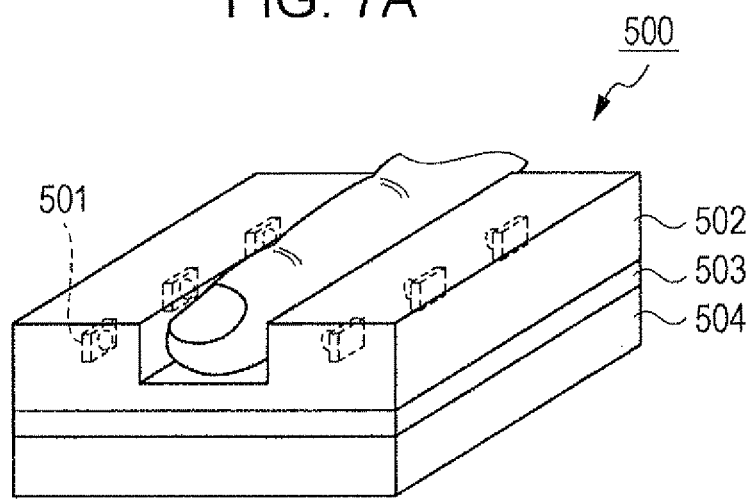
FIG. 7A is a schematic perspective view of a biometric authentication apparatus.

An electronic apparatus according to an embodiment of the invention, used as a biometric authentication apparatus will now be described with reference to FIGS. 7A and 7B. FIG. 7A is a schematic perspective view of the biometric authentication apparatus, and FIG. 7B is a schematic sectional view of the biometric authentication apparatus.

Figure 7B:
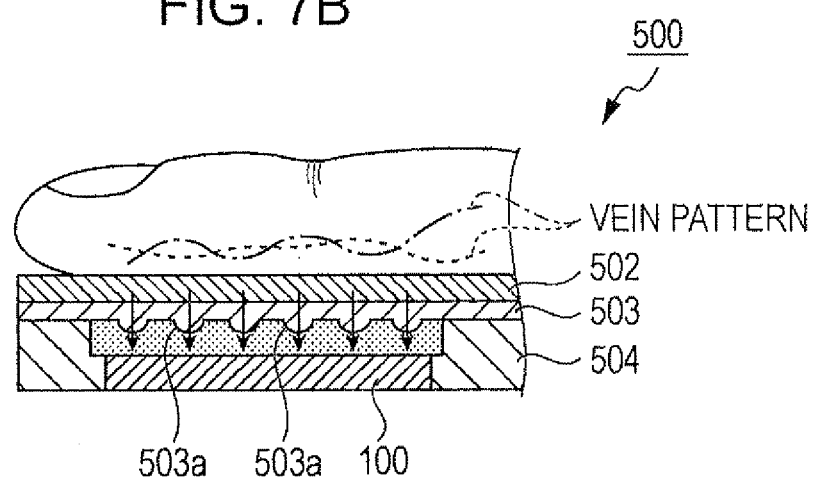
FIG. 7B is a schematic sectional view of the biometric authentication apparatus.

The biometric authentication apparatus 500 of the present embodiment identifies an individual by optically detecting (imaging) a vein pattern of a finger thereon, and comparing the detected vein pattern with vein patterns of registered individuals, and thus authenticates the identity of the individual, as shown in FIGS. 7A and 7B.

More specifically, the biometric authentication apparatus 500 includes an object receiver 502 having a groove in which a finger is to be placed, an image pickup portion 504 provided with the photoelectric conversion device or image sensor 100 according to the above embodiment, and a micro lens array 503 disposed between the object receiver 502 and the image pickup portion 504.

The object receiver 502 contains light sources 501 arranged along both sides of the groove. Each light source 501 is, for example, a light emitting diode (LED) or electroluminescent (EL) element that emits near-infrared light other than visible light, from the viewpoint of taking images of vein patterns without being influenced by outdoor daylight.

The light sources 501 irradiate the vein pattern in a finger, and the image light of the pattern is condensed onto the image sensor 100 through the micro lenses 503a of the micro lens array 503. The micro lenses 503a may be disposed corresponding to each photosensor 50 of the image sensor 100, or may be disposed for each set of photosensors 50.

In addition, an optical compensation plate may be provided between the object receiver 502 containing the light sources 501 and the micro lens array 503 for compensating the unevenness in the brightness of light from the light sources 501.

Since the biometrics authentication apparatus 500 includes a highly sensitive image sensor 100 that can sensitively receive near-infrared light and output an irradiated vein pattern as an image pattern, the apparatus 500 can reliably authenticate the identities of living bodies (human bodies).

Various modifications of the above-described embodiments may be made. Some of the modifications will be described below.

Modification 1

In the image sensor 100, the electrical configuration and connection of the photosensors 50 are not limited to those disclosed in the above embodiment. For example, the photodiode 20 may be electrically connected to the gate electrode 3g of the corresponding TFT 10 so that light received by the photosensor 20 can be detected as a change in voltage or current between the source electrode 5s and the drain electrode 5d.

Modification 2

The shape in plan view of the light-receiving region 50a of the photosensor 50 is not limited to that disclosed in the above embodiment. For example, the light-receiving region 50a may be in a round or oval form, or in a polygonal form, such as triangular, rectangular or pentagonal form.

Modification 3

The electronic apparatus including the disclosed image sensor 100 is not limited to the biometrics authentication apparatus 500. For example, it may be a solid state image pickup apparatus that takes images of fingerprints or eyeballs. Also, the structure of the photoelectric conversion portion 26 can be applied to a solar cell.

What is claimed is:

1. An electronic apparatus comprising a photoelectric conversion device, the photoelectric conversion device comprising:
   a first electrode;
      an optically transparent second electrode opposing the first electrode; and
      a photoelectric conversion portion, at least a portion of which is disposed between the first electrode and the second electrode, the photoelectric conversion portion including a light absorption layer made of a p-type chalcopyrite compound semiconductor film, a window layer made of an n-type semiconductor film, and an amorphous oxide semiconductor layer between the light absorption layer and the window layer,
   wherein the amorphous oxide semiconductor layer has a thickness of 50 to 500 nm,
   wherein the amorphous oxide semiconductor layer contains In, Ga and Zn,
   and wherein the electronic apparatus further comprises:
      an object receiver having a groove configured to receive a finger;
      an image pickup portion including the photoelectric conversion device;
      a micro lens array between the object receiver and the image pickup portion; and
      an optical compensation plate between the object receiver and the micro lens array, the optical compensation plate configured to compensate for unevenness in brightness of light from light sources.

2. The electronic apparatus according to claim 1, wherein the photoelectric conversion portion has a side wall and the photoelectric conversion device includes an insulating film that covers the side wall and an outer edge of a surface of the photoelectric conversion portion opposing the second electrode.

3. The electronic apparatus according to claim 1, wherein the first electrode is a plurality of first electrodes and the window layer includes the second electrode, the window layer opposing the plurality of first electrodes.

4. The electronic apparatus according to claim 1, wherein the electronic apparatus is a biometric authentication apparatus configured to identify an individual by imaging a vein pattern on a finger.

5. The electronic apparatus according to claim 1, wherein the object receiver contains a plurality of light sources that emit near-infrared light arranged along both sides of the groove.

6. An electronic apparatus comprising a photoelectric conversion device, the photoelectric conversion device comprising:
   a first electrode;
   an optically transparent second electrode opposing the first electrode; and
   a photoelectric conversion portion between the first electrode and the second electrode, the photoelectric conversion portion including a p-type crystalline compound semiconductor film, an n-type semiconductor film, and an amorphous oxide semiconductor layer between the p-type crystalline compound semiconductor film and the n-type semiconductor film,
      wherein the amorphous oxide semiconductor layer has a thickness of 50 to 500 nm, and
      wherein the amorphous oxide semiconductor layer contains In, Ga and Zn,
   and wherein the electronic apparatus further comprises:
      an object receiver having a groove configured to receive a finger;
      an image pickup portion including the photoelectric conversion device;
      a micro lens array between the object receiver and the image pickup portion; and
      an optical compensation plate between the object receiver and the micro lens array, the optical compensation plate configured to compensate for unevenness in brightness of light from light sources.

7. The photoelectric conversion device according to claim 6, wherein the amorphous oxide semiconductor layer has a larger band gap than the p-type crystalline compound semiconductor film.

8. The photoelectric conversion device according to claim 6, wherein the amorphous oxide semiconductor layer has a band gap of 3 eV or more.

9. The electronic apparatus according to claim 6, wherein the electronic apparatus is a biometric authentication apparatus configured to identify an individual by imaging a vein pattern on a finger.

* * * * *